United States Patent [19]
Kobayashi et al.

[11] Patent Number: 5,027,327
[45] Date of Patent: Jun. 25, 1991

[54] SEMICONDUCTOR MEMORY

[75] Inventors: Makiji Kobayashi, Kawasaki; Mitsuo Isobe, Tama; Tatsuya Inatsuki, Tokyo; Hisashi Ueno, Kawasaki, all of Japan

[73] Assignee: Kabushiki Kaisha Toshiba, Kawasaki, Japan

[21] Appl. No.: 339,661

[22] Filed: Apr. 18, 1989

[30] Foreign Application Priority Data

Apr. 19, 1988 [JP] Japan ................................. 63-96147

[51] Int. Cl.⁵ .......................................... G11C 11/406
[52] U.S. Cl. .................................................. 365/222
[58] Field of Search ................ 365/222, 201; 371/21.1

[56] References Cited

U.S. PATENT DOCUMENTS 4,625,301 11/1986 Berger ................................. 365/222
4,672,583 6/1987 Nakaizumi .......................... 365/222

OTHER PUBLICATIONS

Toshi Corporation, "MOS Memory Products" Data Book, Jan. 1988, pp. 307-317.

Primary Examiner—Joseph A. Popek
Attorney, Agent, or Firm—Foley & Lardner

[57] ABSTRACT

A semiconductor memory having dynamic memory cells includes a determining circuit for determining whether or not it is necessary to refresh the dynamic memory cells, and only when it is necessary, outputting a refresh execution signal in response to a refresh request signal from an external circuit, and a circuit for executing a refresh operation in response to the refresh execution signal. Even if the refresh request signal is supplied, a refresh operation is not executed unless the determining circuit determines that the refresh operation is necessary, thus dispensing with unnecessary refresh operations. Preferably, the determining circuit includes a timer which outputs a signal at every predetermined period. Only when the signal is output from the timer, is the refresh request signal from an external circuit accepted and the refresh execution signal output.

10 Claims, 8 Drawing Sheets

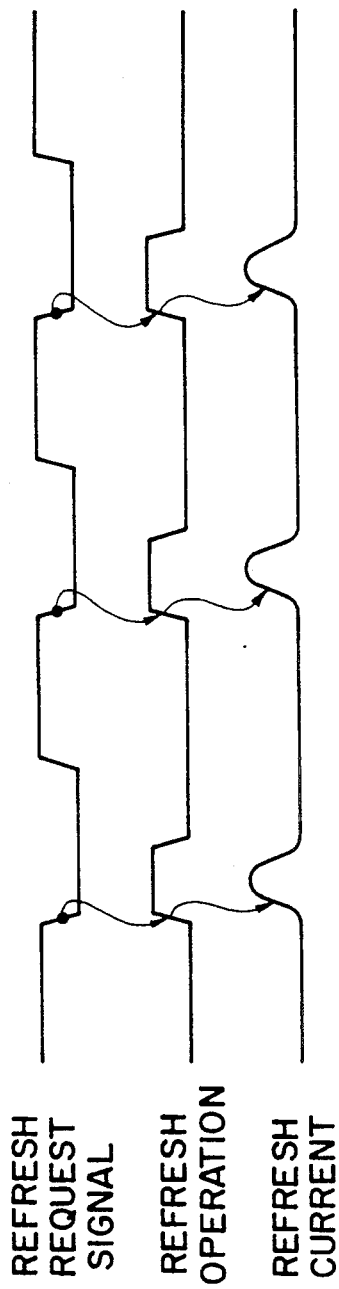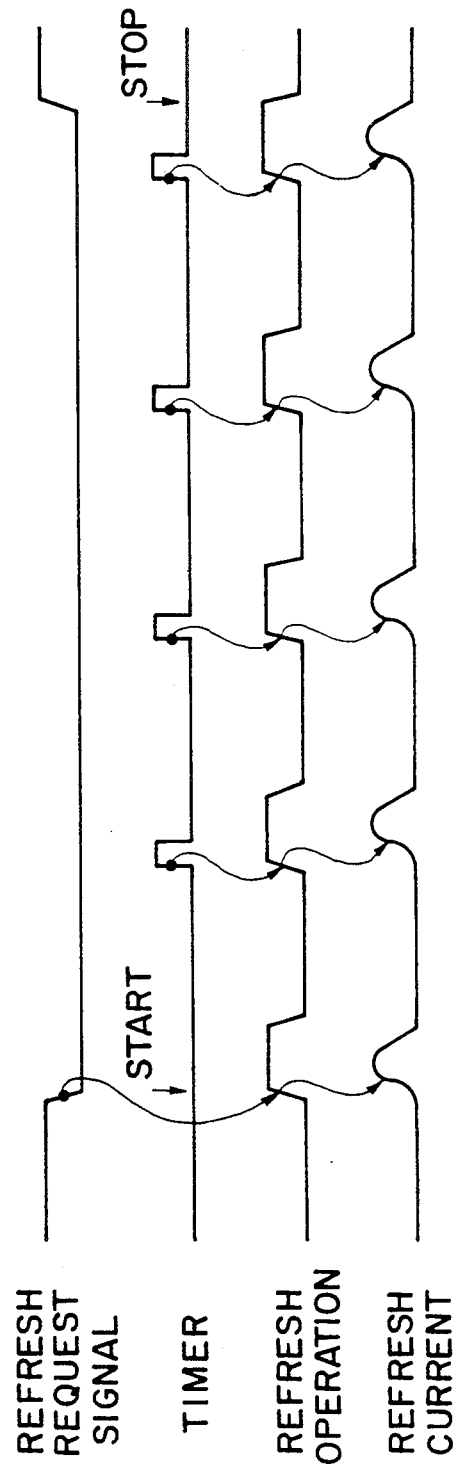

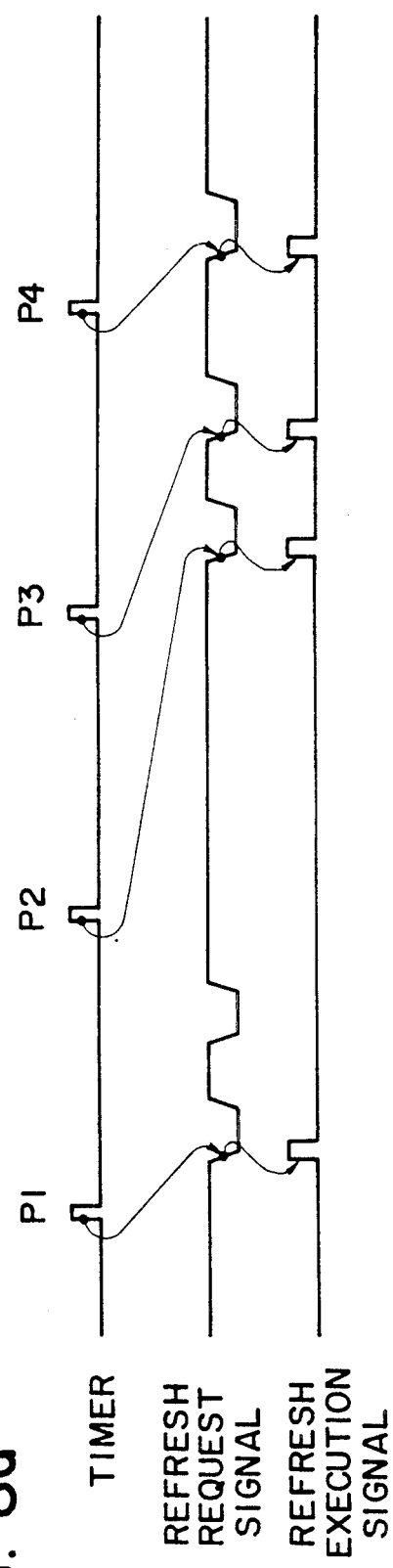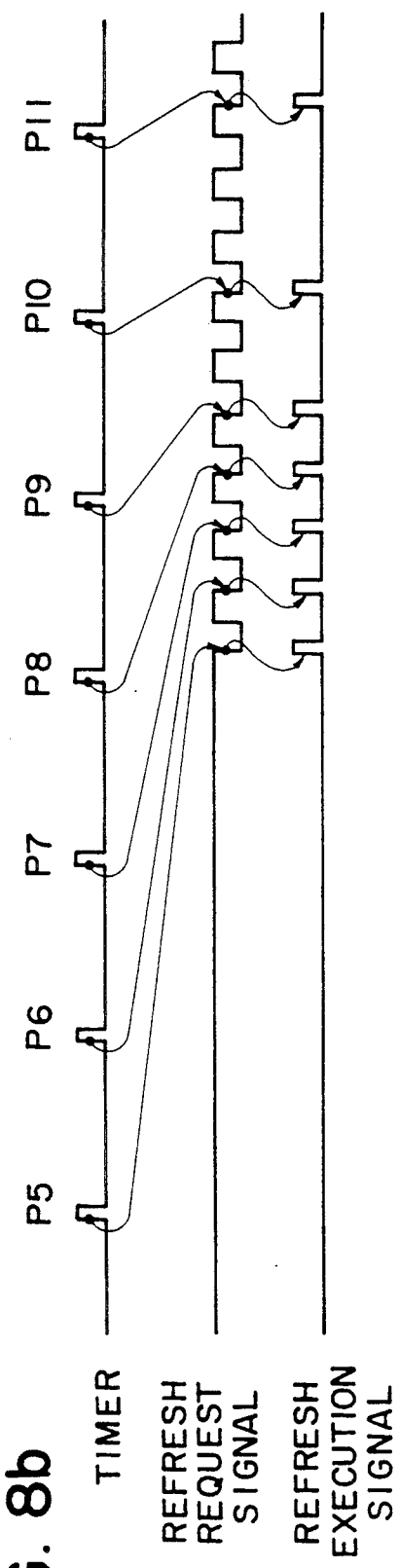

5,027,327

SEMICONDUCTOR MEMORY

BACKGROUND OF THE INVENTION

The present invention relates to a semiconductor memory having dynamic memory cells, and more particularly to improved control for refresh operation of such semiconductor memories. The use of pseudo static RAM (hereinafter abbreviated as PS RAM) is favored nowadays because they are constructed of dynamic memory cells and static peripheral circuits and have the advantages of both.

Conventional refresh operation for a dynamic memory cell such as a PS RAM includes the three types of operation of chip-only refresh, auto refresh and self refresh. According to chip-only refresh operation, a refresh address is supplied to a memory externally to effect dummy access and then refresh operation. According to auto refresh operation, a refresh address counter is incorporated into a RAM to supply to its refresh terminal a refresh request signal clocked externally as shown in the timing chart of FIG. 1, to thus effect refresh operation each time the refresh request signal is input. The refresh period is determined in accordance with the period of the refresh request signals. According to self refresh operation, a refresh address counter and timer are included in the RAM to drive the timer while maintaining the external refresh request signal at the low (L) level as shown in the timing chart of FIG. 2, to therefore effect refresh operation for each carry-over cycle of the timer. The refresh cycle is determined in accordance with the count cycle of the internal timer counter.

An example of a computer system using PS RAM is shown in FIG. 3. In the operation of this system, by using a chip enable signal ROM-CE of, e.g., ROM 2 as a refresh request signal, auto refresh operation is performed at each operation code fetch cycle of CPU 1. During non-operation of this system, by setting the refresh request signal at the low "L" level and driving an internal timer of PS RAM 3, self refresh operation is performed. Such refresh operations are the main trend in applications.

As described above, during the operation of a conventional system using PS RAM, an auto refresh operation is performed by supplying a refresh request signal at each operation code fetch cycle. In this case, each time a refresh request signal is received, all PS RAM are refreshed as required and so a large refresh current is required. For instance, in the system shown in FIG. 3, four PS RAM are used to thus consume refresh current for four chips each time a refresh request signal is received, as shown in FIG. 4. The system power supply is accordingly required to be made large, hindering the system from being made compact and from saving energy. Furthermore, it is undesirable that the refresh current be several times as large as the operation current of PS RAMs of a large system which consumes an operation current corresponding only to 1 to 2 chips. Furthermore, although it is sufficient for ordinary PS RAM to be refreshed at a period of 16 microseconds or more, a shorter auto refresh period such as several to 1 microseconds or less is now used as the operation speed of the CPU is made high, thus consuming an unnecessarily large refresh current.

There are tradeoffs to consider, however, between a large current consumption and a simplified circuit arrangement of such a system.

SUMMARY OF THE INVENTION

It is an object of the present invention to dispense with unnecessary refresh operation in a system using a memory with dynamic memory cells, and to reduce a burden of power supply, while ensuring stable system operation.

According to the present invention, there is provided a semiconductor memory which comprises means for determining whether or not it is necessary to refresh dynamic memory cells in the semiconductor memory, and only when it is necessary, granting a refresh request signal from an external circuit and outputting a refresh execution signal, and means for executing a refresh operation in response to the refresh execution signal.

According to a semiconductor memory of this invention, even if a refresh request signal is supplied, refresh operation is not executed unless the determining means determines that the refresh operation is necessary, thus dispensing with unnecessary refresh operation. In other words, the refresh operation of this invention has both the advantages of conventional auto refresh and self refresh operations.

According to a preferred embodiment of this invention, the determining means comprises a timer and a flip-flop. The timer generates a signal at every predetermined period. The flip-flop is set by the output signal from the timer, receives a refresh request signal only under a set state thereof to generate a refresh execution signal, and is reset after completion of refresh operation.

In the above embodiment, the refresh period is determined by the period of the timer output signals so that a suitable refresh period can be set as desired.

According to another preferred embodiment of this invention, the determining means comprises a timer, a necessary refresh number storage unit, and a refresh execution determining unit. The timer generates a signal at every predetermined period. The necessary refresh number storage unit stores, as the necessary refresh number, the number of timer output signals output during the time when refresh operation is not executed. The refresh execution determining unit receives a refresh request signal from an external circuit and outputs refresh execution signals equal in number to the necessary refresh number.

In the above embodiment, a suitable refresh period can be set as desired by setting the period of timer output signals. Furthermore, even if a refresh request signal is not generated and refresh operation is intercepted because of system stoppage, the number of refresh operations not executed is stored as the necessary refresh number. Upon input of a refresh request signal, refresh operations equal in number to the necessary refresh number are executed for replenishment. Therefore, stored data are not changed or lost and stable system operation is ensured.

BRIEF DESCRIPTION OF THE DRAWINGS

FIG. 1 is a timing chart used for explaining conventional auto refresh operation;

FIG. 2 is a timing chart used for explaining conventional self refresh operation;

FIGS. 8(a) and 8(b) are timing charts used for explaining the operation of the embodiment shown in FIG. 7.

DESCRIPTION OF THE PREFERRED EMBODIMENTS

Figure 5:
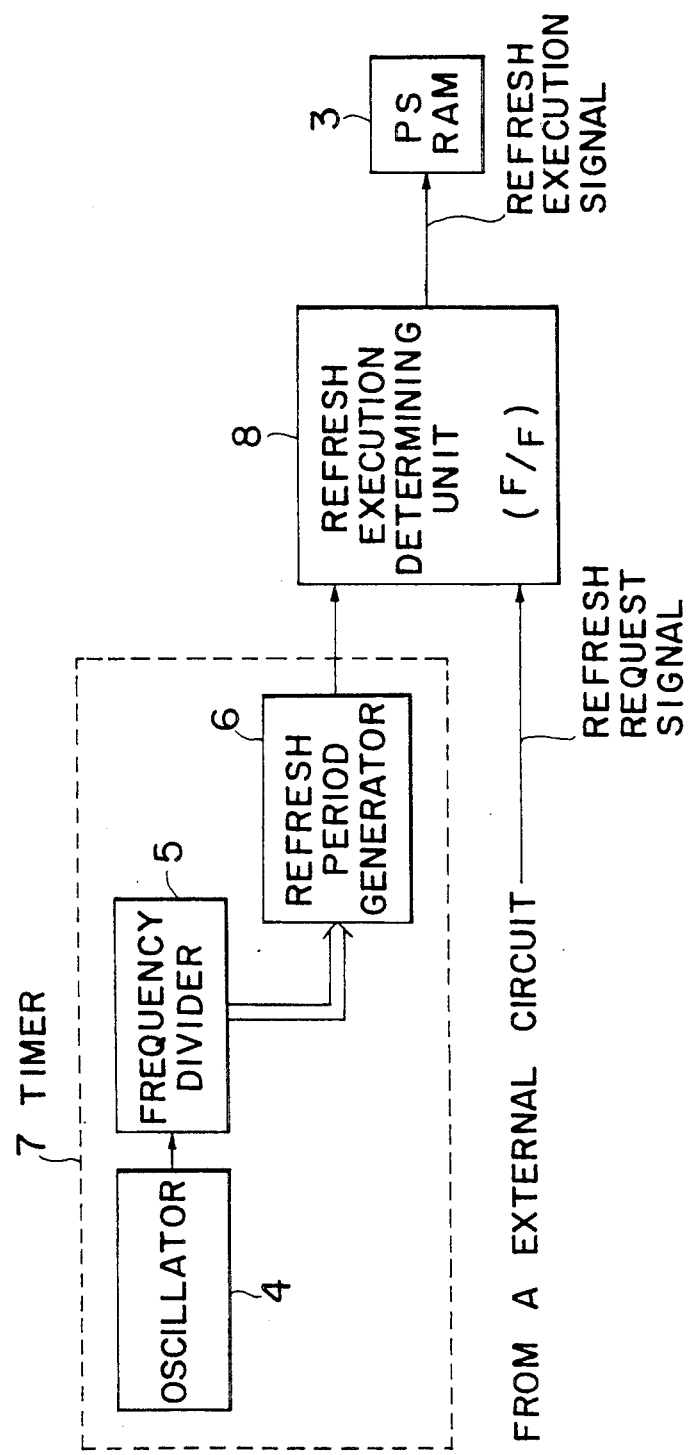
FIG. 5 is a block diagram showing the circuit arrangement of an embodiment of a semiconductor memory according to the present invention.

FIG. 5 is a block diagram showing the circuit arrangement of a preferred embodiment of a semiconductor memory according to the present invention.

As shown in FIG. 5, the circuit of this embodiment is constructed of a timer 7, refresh execution determining unit 8 and PS RAMs 3. The timer 7 is comprised by an oscillator 4, frequency divider 5 and refresh period generator 6, and generates a pulse signal at every predetermined period. The refresh execution determining unit 8 determines, each time upon reception of the pulse signal from the timer 7, whether or not a refresh operation is necessary, and only when it is determined necessary, generates a refresh execution signal in response to a refresh request signal from an external circuit. In a conventional self-refresh operation, a timer of a PS RAM operates only when a refresh request signal is at the low "L" level. However, in this embodiment, the timer 7 operates continuously. The refresh request determining unit 8 is constructed of a flip-flop (F/F) circuit which is set by the output pulse from the timer 7. When the flip-flop circuit in a set state receives the refresh request signal, it outputs a refresh execution signal which is supplied to a refresh terminal of PS RAM 3. PS RAM 3 has the same circuit arrangement as conventional PS RAM chip so that upon reception of the refresh execution signal at its refresh terminal, a refresh operation is executed. The refresh execution signal also operates to reset the refresh execution determining unit 8.

Figure 3:
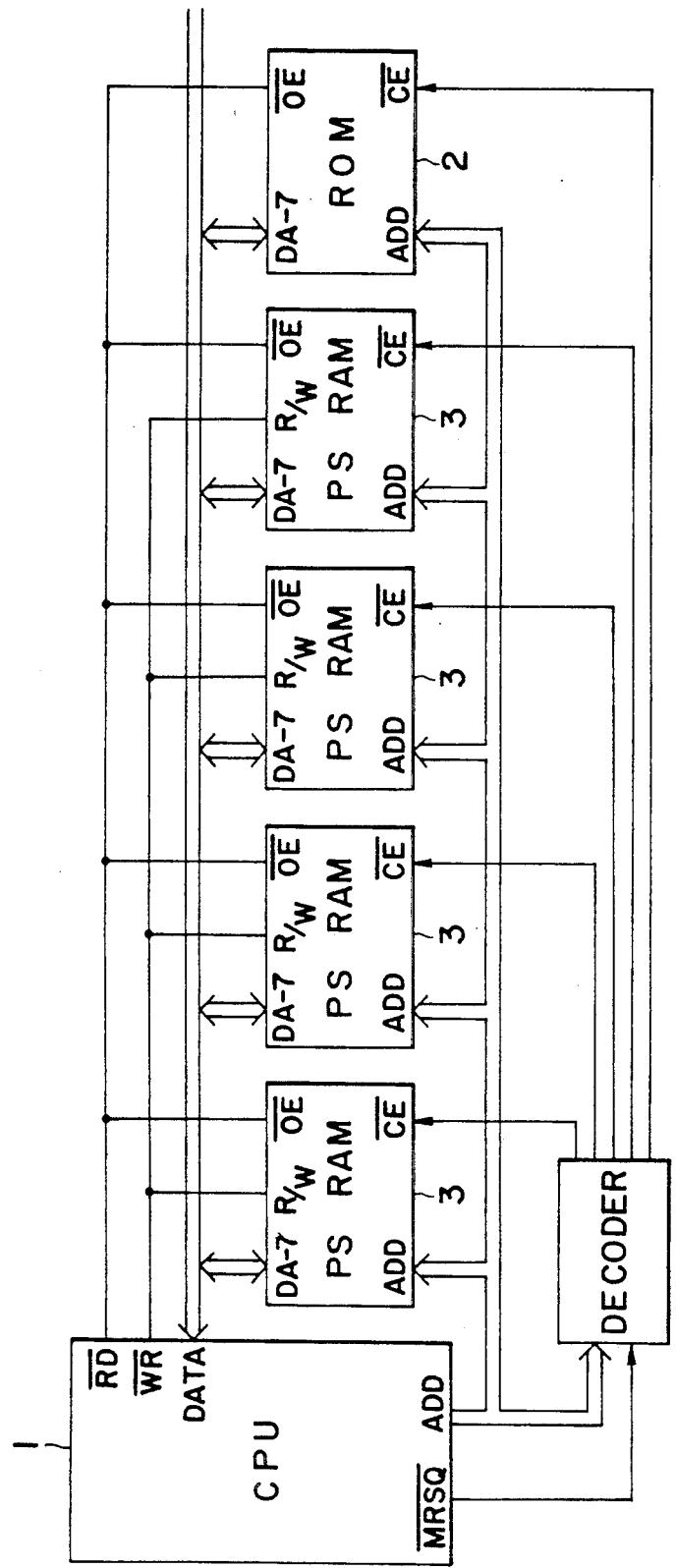
FIG. 3 is a block diagram showing an example of a computer system using PS RAMs.
Figure 4:
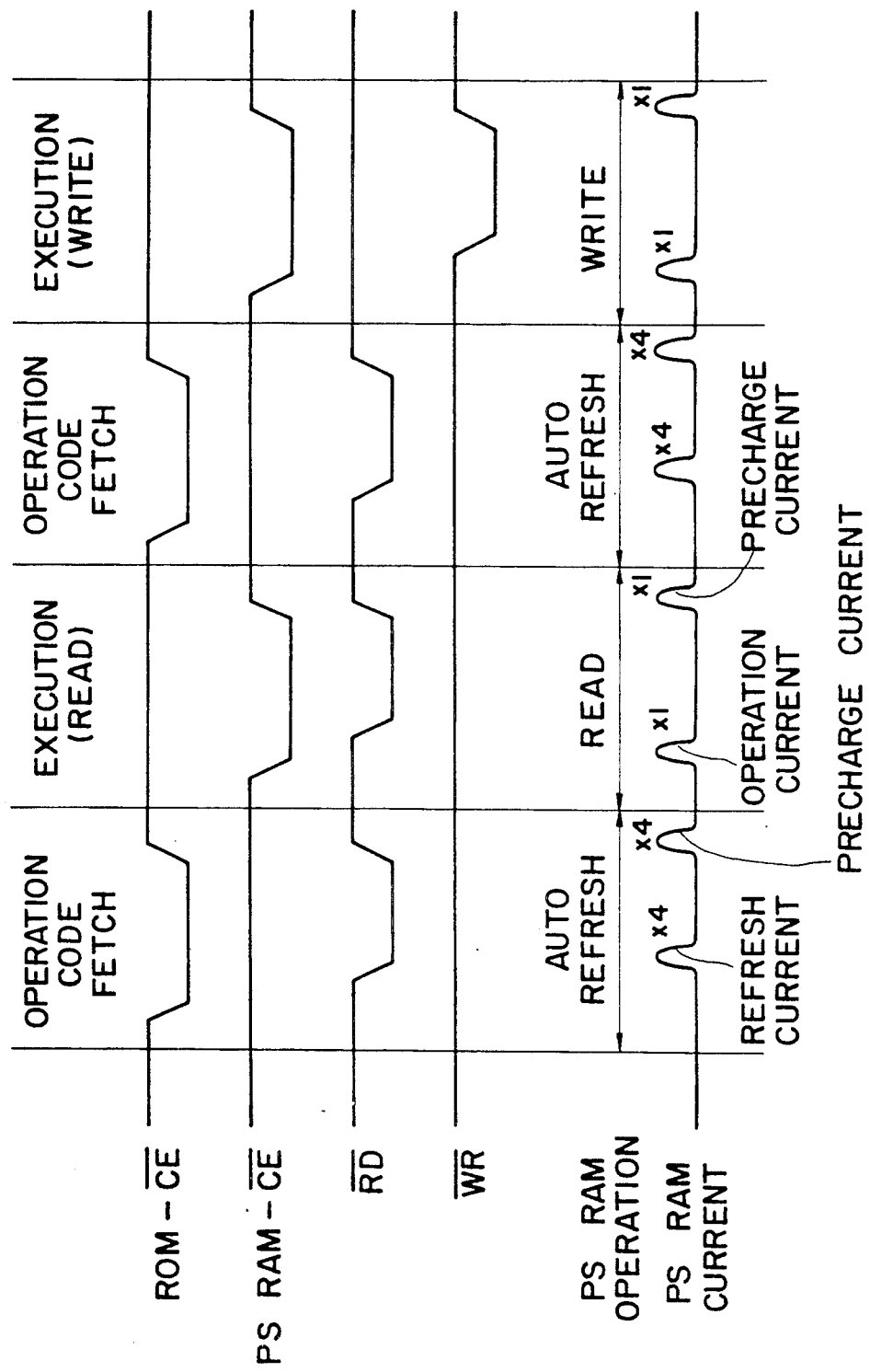
FIG. 4 is a timing chart used for explaining the operation of the system shown in FIG. 3.
Figure 6:
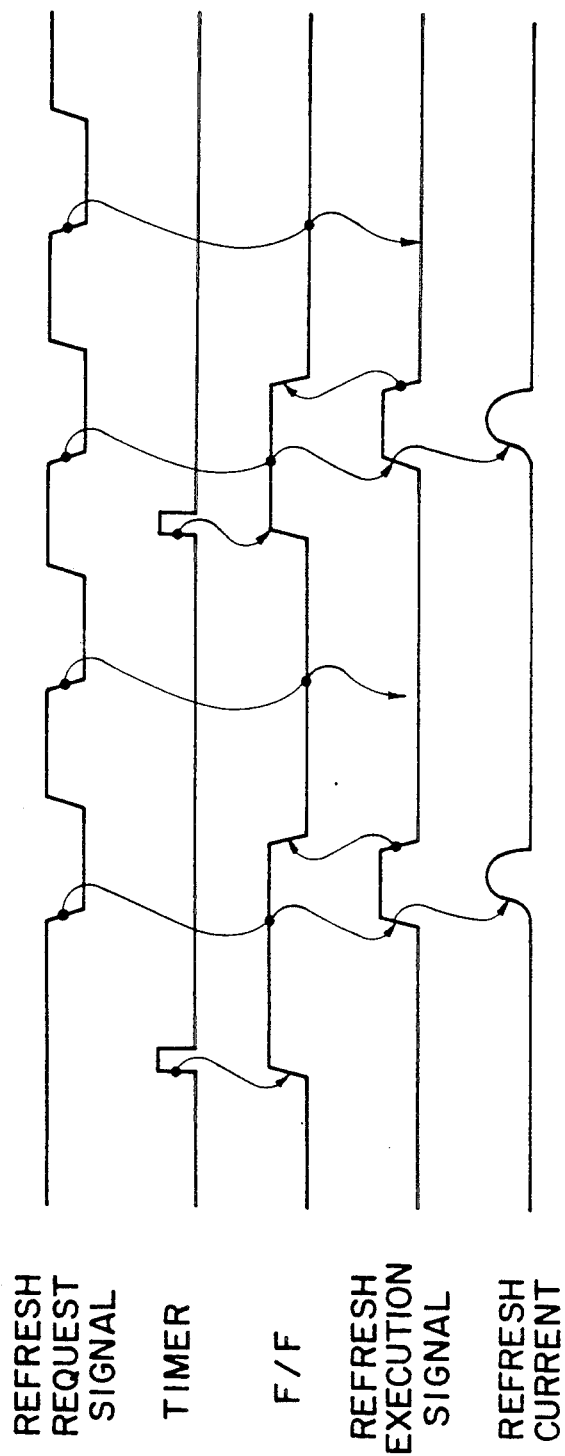
FIG. 6 is a timing chart used for explaining the operation of the embodiment shown in FIG. 5.

A refresh operation to be carried out by this embodiment when applied to a system such as shown in FIG. 3 will be described with reference to the timing chart of FIG. 6.

In the operation of the system, the refresh request signal is supplied at each operation code fetch cycle of CPU 1. A pulse is output from the timer 7 at every predetermined period to match the need for refresh operation for the devices. Upon receipt of the output pulse from the timer 7, the refresh execution determining unit (F/F) 8 is set. Only under this set state, the F/F 8 responds to the refresh request signal and outputs the refresh execution signal to effect refresh operation. After completion of this refresh operation, the refresh execution determining unit (F/F) 8 is reset. During the time duration from this resetting to the next setting, any refresh request signal is not accepted to F/F 8 and hence refresh operation is not executed.

Since refresh operation is executed only while a device requires it, current consumption is reduced considerably. For instance, in the case of a system using one chip PS RAM, according to the conventional art a refresh current substantially the same as its operation current has been required. However, in this embodiment, since the number of refresh operations is reduced to a negligible number when compared to the number of read/write accesses to the PS RAM, the current consumption can be considered to be operation current only, thus reducing it to about ½ of the conventional. The current consumption is inversely proportional to the number of chips used in a system.

Figure 7:
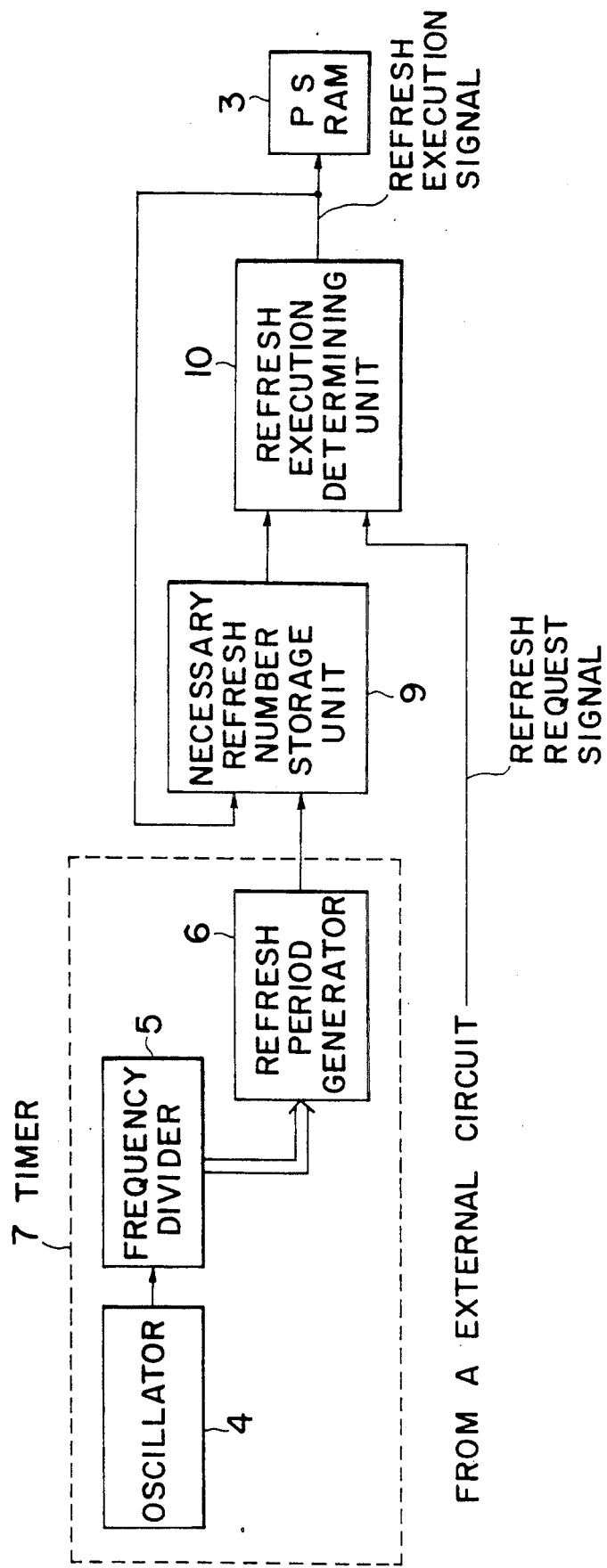
FIG. 7 is a block diagram showing the circuit arrangement of a second embodiment of a semiconductor memory according to the present invention.

In the embodiment shown in FIG. 5, if the refresh request signal is not supplied for a time duration longer than the period of output pulses from the timer 7 because of system stoppage or other reasons, then refresh operation is not executed during that duration so that there arises a possibility of change or loss of stored data. FIG. 7 shows the circuit arrangement of another embodiment of a semiconductor memory in which a backup function for such a case is added. In FIG. 7, like elements to those shown in FIG. 5 are represented by using identical reference numerals.

The characteristic feature of this embodiment is to provide a necessary-refresh-number storage unit 9 and refresh execution determining unit 10. The storage unit 9 stores, as the necessary-refresh-number, the number of refresh operations cancelled out due to there being no refresh request signal for the time duration longer than the period of output pulses from the timer 7. Upon receipt of a new refresh request signal from the external, the refresh execution determining unit 10 outputs refresh execution signals equal in number to the necessary-refresh-number stored in the storage unit 9. The storage unit 9 is constructed of an up/down counter which counts up an output pulse from the timer 7, and counts down a refresh execution signal so that the count value thereof represents the necessary-refresh-number.

The refresh operation of this embodiment will be described with reference to FIG. 8(a) and 8(b).

In the case of the timing chart shown in FIG. 8(a), refresh request signals are output in a dispersed manner such that two refresh request signals are output after output pulse P1 from the timer 7, and after a lapse of certain time duration, two refresh pulses are output after pulse P2, and one refresh pulse signal after pulse P4. Particularly, the count value of the storage unit 9 becomes 1 upon receipt of pulse P1. Upon receipt of the next refresh request signal, the refresh execution determining unit 10 outputs one refresh execution signal to therefore execute a refresh operation once. Upon output of this refresh execution signal, the count value of the storage unit 9 becomes 0 so that a refresh execution signal is not outputted for the next refresh request signal and a refresh operation is not executed accordingly. Upon receipt of pulses P2 and P3, the count value of the necessary refresh number storage unit 9 becomes 2 so that at the next refresh request signal, two refresh execution signals are output and the refresh operation is executed two times consecutively.

In the case of the timing chart shown in FIG. 8(b), the refresh request pulse is not output after pulses P5, P6 and P7, but it is output for the first time after pulse P8. In such a case, the count value of the storage unit 9 becomes 4 upon receipt of pulses P5 to P8. Therefore, upon receipt of the next refresh request signal, the refresh request signal is output four times consecutively to execute the refresh operation concentrically. Thereafter, in the similar manner to the case shown in FIG.

8(a), an auto refresh operation is executed at each refresh request signal after pulses P9 and P10.

As above, replenishing auto refresh operations equal in number to the necessary-refresh-number are carried out, so that it is expected that there is no fear of change or loss of data and that stable system operation is ensured.

Figure 9:
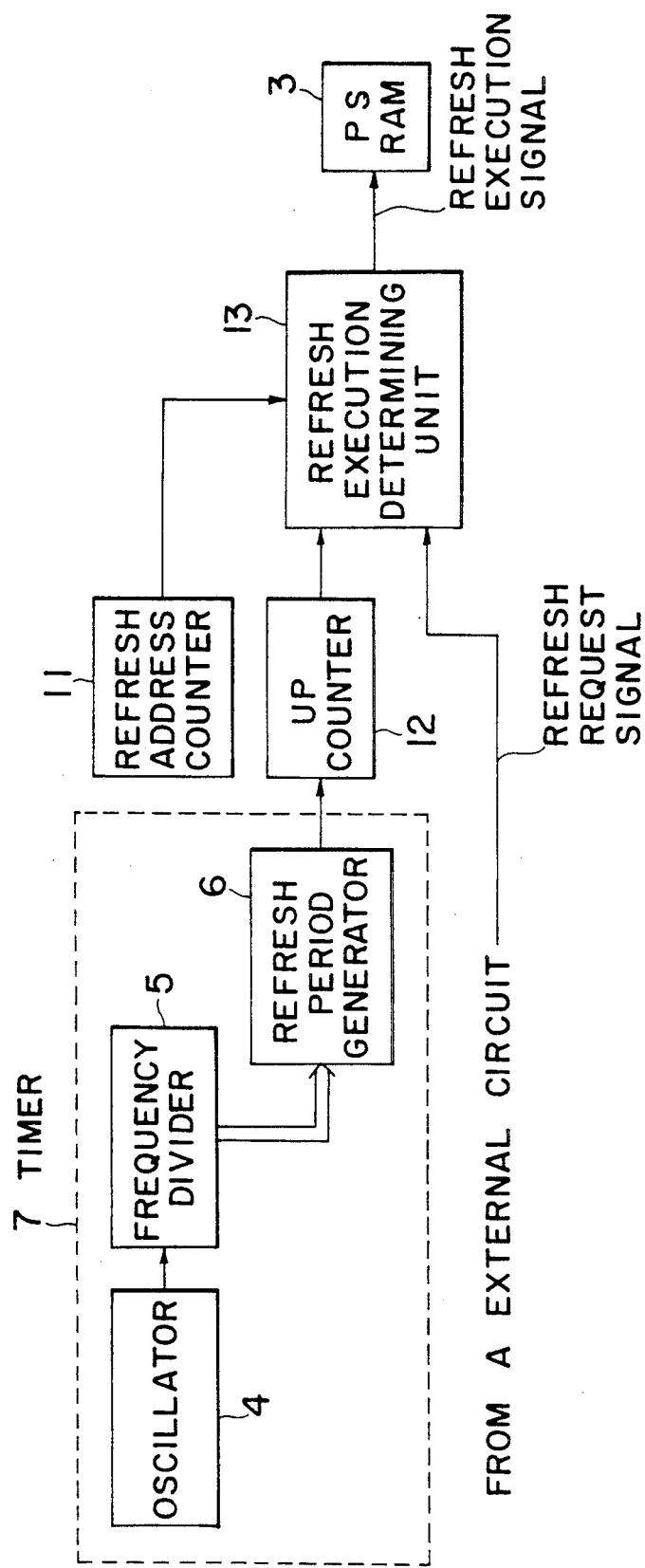
FIG. 9 is a block diagram showing the circuit arrangement of a third embodiment of a semiconductor memory according to the present invention.

In the above embodiment, the necessary-refresh-number storage unit 9 has been realized using an up-/down counter which has a rather complex circuit arrangement and requires a large space therefor. In view of this, the counter for storing the necessary-refresh-number is realized using an up-counter similar in construction to a refresh address counter to make the circuit simple and small, an embodiment of which is shown in FIG. 9.

In this embodiment, there are provided a refresh address counter 11, up-counter 12 and refresh execution determining unit 13. The refresh address counter 11 has the same construction as that of a refresh address counter used with conventional PS RAM or DRAM, and increments its address value upon execution of a refresh operation, as well known in the art. The up-counter 12 having the same construction as that of the refresh address counter 11 counts up an output pulse from the timer 7. Upon reception of a refresh request signal, the refresh execution determining unit 13 outputs refresh execution signals concentratedly until the count value of the up-counter becomes equal to the address value of the refresh address counter 11.

In this embodiment, in the case where refresh operations have been cancelled out for any number of times because of no refresh request signal, the count value of the up-counter 12 is larger than the address value of the refresh address counter 11 by the amount corresponding to the number of cancelled refresh operations. The difference between the address value and count value represents the necessary-refresh-number. Thus, the refresh operations are executed concentratedly upon receipt of the next refresh request signal until the difference becomes 0, i.e., necessary-refresh-number times. The operation of this embodiment is substantially the same as that of the embodiment of FIG. 7 described with FIG. 8.

In the above embodiment, comparison between the address and count values is carried out each time the refresh request signal is supplied. A modification is applicable, wherein the comparison is carried out continuously to always check the necessary-refresh-number and only when the number is not zero, is refresh request signal accepted and the necessary number of refresh operations executed.

As described so far, the semiconductor memory of this invention determines whether or not a refresh operation is necessary, and executes a refresh operation only when necessary. Therefore, unnecessary refresh operation can be dispensed with to therefore reduce a load of power supply.

What is claimed is:

1. A semiconductor memory having dynamic memory cells comprising:
    means for continuously determining whether or not it is necessary to refresh the dynamic memory cells, and if when refresh is necessary, outputting a refresh the execution signal in response to a refresh request signal from an external circuit; and
    means for executing a refresh operation in response to said refresh execution signal.

2. A semiconductor memory according to claim 1, wherein said determining means comprises timer means for outputting a signal periodically, and flip-flop means which is set by said signal from said timer means, receives said refresh request signal only under a set state thereof to generate said refresh execution signal, and is reset after completion of said refresh operation.

3. A semiconductor memory according to claim 1, wherein said determining means comprises timer means for generating a signal periodically, necessary-refresh-number storage means for storing, as a necessary-refresh-number, the number of said signals output from said timer means during the time when said refresh operation is not occurring, and refresh execution determining means for outputting said refresh execution signals equal in number to said necessary-refresh-number in response to said refresh request signal.

4. A semiconductor memory according to claim 3, wherein said necessary-refresh-number storage means includes an up/down counter which counts up said signal output from said timer means and counts down said refresh execution signal, the count value of said up/down counter being said necessary-refresh-number.

5. A semiconductor memory according to claim 3, wherein said necessary refresh number storage means includes an up-counter for counting up said signal output from said timer means and a refresh address counter which increments its address value upon execution of said refresh operation, a difference between the count value of said up-counter and the address value of said refresh address counter being said necessary-refresh-number.

6. A semiconductor memory according to claim 1, wherein said determining means continuously determines whether or not the refresh is necessary irrespective of receipt of the refresh request signal.

7. A semiconductor memory according to claim 1, wherein said determining means includes timer means for outputting a signal periodically, and determining that refresh is necessary when the timer signal is output during the time when the refresh operation is not occurring.

8. A semiconductor memory having dynamic memory cells comprising:
    timer means for generating a signal periodically;
    necessary-refresh-number storage means for storing, as a necessary-refresh-number, the number of said signals output from said timer means during the time when said refresh operation is not occurring;
    refresh execution determining means for outputting refresh execution signals equal in number to said necessary-refresh-number in response to a refresh request signal from an external circuit; and
    means for executing a refresh operation in response to said refresh execution signal.

9. A semiconductor memory according to claim 8, wherein said necessary-refresh-number storage means includes an up/down counter which counts up said signal output from said timer means and counts down said refresh execution signal, the count value of said up/down counter being said necessary-refresh-number.

10. A semiconductor memory according to claim 8, wherein said necessary-refresh-number storage means includes an up-counter for counting up said signal output from said timer means and a refresh address counter which increments its address value upon execution of said refresh operation, a difference between the count value of said up-counter and the address value of said refresh address counter being said necessary-refresh-number.

* * * * *